United States Patent [19]

Szmanda et al.

[11] Patent Number: 5,876,899
[45] Date of Patent: *Mar. 2, 1999

[54] PHOTORESIST COMPOSITIONS

[75] Inventors: Charles R. Szmanda, Westborough; Gary N. Taylor, Marlborough; Robert L. Brainard, Wayland; Manuel DoCanto, Stoughton, all of Mass.

[73] Assignee: Shipley Company, L.L.C., Marlborough, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 718,099

[22] Filed: Sep. 18, 1996

[51] Int. Cl.⁶ .......................... G03C 1/492; C03F 220/10
[52] U.S. Cl. ...................... 430/270.1; 430/285.1; 430/908; 430/916; 526/271; 526/317.1; 526/328.5; 526/329.7
[58] Field of Search ................. 430/270.1, 326, 430/325, 315, 285.1, 916, 908; 526/328, 328.5, 329.7, 271, 317.1

[56] References Cited

U.S. PATENT DOCUMENTS

| | | | |
|---|---|---|---|
| 4,139,391 | 2/1979 | Ikeda et al. | 96/115 R |
| 4,384,037 | 5/1983 | Hosaka et al. | 430/191 |
| 4,491,628 | 1/1985 | Ito et al. | 430/176 |
| 5,128,232 | 7/1992 | Thackery et al. | 430/192 |
| 5,362,600 | 11/1994 | Sinta et al. | 430/192 |
| 5,403,695 | 4/1995 | Hayase et al. | 430/192 |
| 5,492,793 | 2/1996 | Breyta et al. | 430/270.14 |
| 5,587,274 | 12/1996 | Kishida et al. | 430/270.1 |

FOREIGN PATENT DOCUMENTS

| | | |
|---|---|---|
| EP 0 483 693 A2 | 5/1992 | European Pat. Off. . |
| EP 0 564 168 A2 | 10/1993 | European Pat. Off. . |

*Primary Examiner*—John A. McPherson
*Assistant Examiner*—Rosemary Ashton
*Attorney, Agent, or Firm*—Robert L. Goldberg; Peter F. Corless; Darryl P. Frickey

[57] ABSTRACT

A method for making an acrylic resin photoresist characterized by polymerization of an acrylic monomer in a solvent that dissolves all monomers and resultant polymers. The use of the solvent permits formation of acrylic resins suitable for use in the preparation of photoresists without recovery from its reaction mixture. Photoresists prepared from such polymers have improved transparency, especially at exposures of 193 mn or less.

29 Claims, No Drawings

PHOTORESIST COMPOSITIONS

BACKGROUND OF THE INVENTION

1. Introduction

This invention relates to acrylic polymers having improved optical transparency and to photolithographic compositions containing said polymers. More particularly, this invention relates to novel photolithographic coating compositions having improved optical transparency, especially at exposures of 193 nm. The composition is prepared by a direct process that avoids resin recovery as an intermediate step.

2. Description of the Prior Art

Photoresists are photosensitive films used for transfer of images to a substrate. They form negative or positive images. Following the coating of a liquid photoresist composition onto a substrate, the coating is dried and exposed through a patterned photomask to a source of activating energy such as ultraviolet light to form a latent image in the photoresist coating. The photomask has areas that are opaque to activating energy and other areas that are transparent to activating radiation. The opaque and transparent areas define an image to be transferred to an underlying substrate. A relief image is formed in a photoresist film following exposure through the mask by development of the latent imaged pattern in the coating. The use of photoresists is generally described, for example, by DeForest, *Photoresist Materials and Processes*, McGraw Hill Book Company, New York (1975), and by Moreau, *Semi-conductor Lithography, Principles, Practices and Materials*, Plenum Press, New York (1988).

Known photoresists can provide features having resolution and size sufficient for many existing commercial applications. However, for many other applications, the need exists for new photoresists that can provide highly resolved images of sub-micron dimension upon exposure and inclusive of exposure to shorter wavelength activating radiation such as 193 nm. Various attempts have been made to alter the make-up of photoresist compositions to improve performance and functional properties. Among other things, a variety of novel photoactive compounds have been reported for use in photoresist compositions. See, for example, U.S. Pat. No. 4,450,360 and European Application No. 0 615 163, both incorporated herein by reference.

Recently, several acid catalyzed chemically amplified resist compositions have been developed such as those disclosed in U.S. Pat. Nos. 4,968,581; 4,883,740; 4,810,613; and 4,491,628; Canadian Patent Application No. 2,001,384 and Nalamasu et al., "An Overview of Resist Processing for Deep-UV Lithography", *J. Photopolym. Sci. Technol.* 4, 299 (1991). These resists possess improved sensitivity. The chemically amplified resist composition, in one embodiment, comprises a photosensitive acid generator and an acid sensitive polymer. The polymer has acid sensitive side chain (pendant) groups which are bonded to the polymer backbone and are reactive towards a proton. Upon image-wise exposure to radiation, the photoacid generator produces a proton. The resist film is heated causing the photolitically generated proton to cleave the pendant group from the polymer backbone. The released proton is not consumed in the cleavage reaction and catalyzes additional cleavage reactions thereby chemically amplifying the photochemical response of the resist. The cleaved polymer is soluble in polar developers such as alcohol and aqueous base while the unexposed polymer is soluble in non-polar organic solvents. Thus, though the photoresist is primarily used as a positive resist, the resist can produce positive or negative images conforming to the mask dependent upon the selection of the developer and radiation dose.

An alternative chemically amplified resist composition is one containing the photosensitive acid generator and an acid sensitive cross-linking agent. Upon image-wise exposure to activating radiation, the photoacid generator produces a proton. The resist film is heated and the proton released by heating activates the cross-linking agent which reacts with certain functional groups on the polymer backbone curing the same. Again, the proton is not consumed by activation of the cross-linking agent and catalyzes additional cross-linking reactions thereby chemically amplifying the photochemical response of the resist. The cross-linked polymer is soluble in organic solvents and insoluble in alcohol and aqueous base while the unexposed polymer remains soluble in such aqueous base developers. For this reason, though the resists are primarily used as negative resists, they can produce positive or negative images of the mask dependent upon the selection of the developer.

Preferred chemically amplified photoresists comprise an admixture of a photoactive compound and a resin binder that traditionally comprises a copolymer containing phenolic units though more recently developed systems use compolymers of phenolic and non-phenolic units. For example, one preferred group of such copolymers has acid labile groups substantially, essentially or completely only on non-phenolic units of the copolymer. For example, one copolymer binder has repeating units x and y of the following formula:

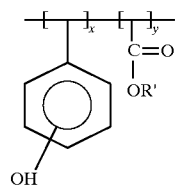

where the hydroxyl group is present at either the ortho, meta or para positions throughout the copolymer, and R' is substituted or unsubstituted alkyl having 1 to about 18 carbon atoms, more typically 1 to about 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, moiety of the acrylate units, serves as the acid labile group of the resin that will undergo photoacid induced cleavage upon exposure of a coating layer of a photoresist containing the resin. Typically, the copolymer will have a $M_w$ in excess of 10,000 Daltons and often up to about 50,000 Daltons, more typically, from about 15,000 to about 30,000 Daltons with a molecular weight distribution of about 3 or less, more preferably a molecular weight distribution of about 2 or less.

The presence of the phenolic units in the above resin results in substantial adsorption of activating radiation, particularly at the near and deep ultraviolet wavelengths. As a consequence, though the acrylate portion of the polymer improves optical transparency, especially to the shorter wavelengths of activating energy, optical transparency of the resin is not fully optimized as a consequence of the phenolic units in the polymer.

A copolymer of an alkyl acrylate such as t-butyl acrylate or t-butyl methacrylate and a vinyl alicyclic such as a vinyl norbornane or vinyl cyclohexanol compound, are also known. Such copolymers may also be prepared by free radical polymerization. Exemplary polymers and photoresists using such polymers are disclosed in U.S. Pat. No. 5,492,793 incorporated herein by reference. Copolymers of the type described in this patent possess enhanced sensitivity as a consequence of the copolymerized acrylate units in the polymer. It is known in the art that acrylic resins have desirable optical transparency properties, particularly at the shorter wavelengths. Good optical transparency in a photoresist is essential for certain uses.

Because of their excellent optical transparency, acrylic polymers of the type described above have been used as binders in the formulation of many photoresist compositions, especially for those photoresists where optical transparency is essential. However, it is known that the presence of the aromatic ring reduces optical transparency at certain wavelengths, especially at the shorter wavelengths such as 193 nm and below. In addition, it has been found that the acrylic polymers, though optically transparent when made, have a tendency to yellow upon standing, thus reducing the optical transparency of the resist as it ages. Antioxidants have been added to photoresists to prevent yellowing, but have been found to be ineffective or have been found to interfere with the photolithographic chemistry of the photoresist composition.

SUMMARY OF THE INVENTION

The subject invention is for an aliphatic acrylic polymer having improved optical transparency, especially for exposure to activating radiation at a wavelength of 193 nm and below, and to a process for making the same. The invention is also directed to photoresists using such polymers as binders. The photoresists of the invention are characterized by enhanced optical transparency, both at the time of manufacture and following prolonged storage.

The polymers of the invention are formed by free radical polymerization of an acrylic monomer mixture, preferably an aliphatic monomer mixture, using a reaction solvent that dissolves all monomers, resultant polymers and additives, and is suitable for use as a casting solvent for the resultant polymer. In accordance with the invention, the solvent functions as a solvent for reaction and as a casting solvent for a photoresist composition whereby the need to recover polymer from its reaction solution and redissolve the same in a coating solvent to form a photoresist coating composition is avoided. By elimination of aromatic components from the monomer mixture, the polymer obtained has enhanced optical transparency. In addition, it has been found that acrylic polymers produced as described have enhanced optical transparency after storage and prior to use due to a reduced tendency for the acrylic polymer to discolor (yellow).

DESCRIPTION OF THE PREFERRED EMBODIMENTS

The subject invention is directed to the formation of acrylic polymers suitable for use as binders for positive and negative acting chemically amplified photoresist compositions. The term acrylic polymer as used herein means a polymer made from one or more acrylic and/or methacrylic monomers alone or in combination with other vinyl monomers where at least 50 mole percent of the monomer mixture comprises the acrylic or methacrylic monomers.

Chemically amplified photoresists are well known in the art as discussed above. The positive acting chemically amplified photoresist comprises a polymer having pendant acid labile groups and a photoacid generator. The acid labile groups inhibit dissolution of the polymer in developer. Upon exposure of such a photoresist composition to patterned activating radiation, such as near or deep ultraviolet irradiation, the photoacid generator in photoexposed areas of the photoresist coating decomposes to yield an acid. Upon heating, the liberated acid cleaves the acid labile groups on the polymer whereby a high solubility differential in developer forms between exposed and unexposed regions of the coating.

In the positive acting chemically amplified photoresist system described above, the acid labile group substituted on the polymer may be any group that cleaves in the presence of photogenerated acid. A preferred group that has been found is the isobornyl group which is sufficiently acid labile whereby it cleaves in the presence of acid catalyst. Accordingly, if isobornyl acrylate or methacrylate is the monomer used to form the acrylic resin, then the isobornyl group can function as the acid labile group. Other acid cleavable groups known in the art include the imide group represented by the formula:

$$\begin{array}{c} O \quad H \quad O \\ \parallel \quad | \quad \parallel \\ (-C-N-C-) \end{array}$$

which can be blocked with certain groups, X, to form compounds having the structure $$\begin{array}{c} O \quad X \quad O \\ \parallel \quad | \quad \parallel \\ (-C-N-C-) \end{array}$$

which has solubility properties different from the unblocked imide. These X groups can be cleaved by acid to regenerate the unblocked imide. When the imide group is incorporated into a polymer, the polymer having the blocked imide group can be made to function as a resist when combined with a photoacid generator. The acid labile group on the imide should be one that is reasonably stable at a temperature of at least 100° C., preferably up to about 150° C., to enable baking of a freshly spun resist coating. Preferably, the acid-labile protecting group is an ester group of the formula:

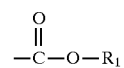

where $R_1$ is an alkyl, aryl or substituted alkyl or aryl group. The preferred acid labile group for substitution on the imide is the tert-butoxy carbonyl group

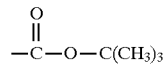

which has been found to be easily attached to a preformed imide, is relatively stable below about 110° C. and is not readily attacked by aqueous alkali or reactive in the presence of unexposed, latent photoacid. Methods for substituting an acid labile group on an imide can be found in U.S. Pat. No. 4,968,581 incorporated herein by reference.

Tert-butyl esters of carboxylic acids and tert-butyl carbonates of pendant hydroxyl groups are also suitable acid cleavable groups in accordance with the subject invention. Methods for formation of polymers having these acid cleavable groups are disclosed in U.S. Pat. No. 4,491,628 incorporated herein by reference.

Acetate groups, though lesser preferred, have also been disclosed as suitable acid labile groups. Such acetate groups have the formula

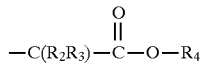

where $R_2$ and $R_3$ are each independently selected from the group of hydrogen, an electron withdrawing group such as halogen, lower alkyl having from 1 to about 10 carbon atoms, and substituted lower alkyl having from 1 to about 10 carbon atoms; and $R_4$ is substituted or unsubstituted lower alkyl having from 1 to about 10 carbon atoms, or substituted or unsubstituted benzyl having seven to about thirteen carbon atoms. The substituents can be, for example, one or more of halogen, lower alkyl, lower alkoxy, aryl or benzyl. $R_2$ and $R_3$ are desirably each hydrogen. It is known that if $R_2$ and/or $R_3$ are halogen or other suitable electron withdrawing group, upon acid cleavage of the acetate group, a highly polar moiety is provided along with enhanced solubility differentials between exposed and unexposed regions of the coating. The difluoro group is particularly suitable for such purposes and provides extremely high dissolution differentials between exposed and unexposed regions with only modest levels of substitution onto pendant groups of the polymer binder. Methods for substitution of acetate acid labile groups on polymer binders are disclosed in U.S. Pat. No. 5,362,600 incorporated herein by reference.

An additional acid labile group is disclosed in U.S. patent application Ser. No. 08/534,565 filed Sep. 27, 1995, now U.S. Pat. No. 5,719,003, assigned to common assignee and incorporated herein by reference. In accordance with this application, a vinyl ether blocking group is used having the structure —(CH=CH)—O—. The vinyl ether group is reacted with a hydroxy group in the presence of a catalytic amount of a strong acid such as hydrochloric acid, sulfuric acid, malonic acid or a sulphonic acid. This is a desirable blocking group as deblocking results in reformation of the hydroxyl group thereby providing a resist having excellent differential solubility in developer. Typical vinyl compounds and reaction mechanism can be found in the above identified patent application.

Negative acting chemically amplified photoresist compositions operate by an acid catalyzed cross-linking reaction between a cross-linking agent and active functional groups on the polymer backbone such as hydroxyl groups. As in the case of positive acting photoresists, the acid is generated by exposure of a photoresist coating to activating radiation.

Cross-linking agents suitable for use in chemically amplified negative photoresists are those activated by the generation of acid upon exposure to activating radiation. Any of a variety of compounds or low molecular weight polymers containing a plurality of hydroxyl, carboxyl, amide or imide groups may be used as cross-linking agents for acrylic resins having pendant hydroxyl groups. Suitable cross-linking agents include urea-formaldehyde resins, melamine-formaldehyde resins, benzoguanamine-formaldehyde resins, glycoluril-formaldehyde resins and combinations. Other materials that may be used are latent formaldehyde generating compounds such as s-trioxazine, N-(2-hydroxyethyl) oxazolidine and oxazolidinylethyl methacrylate. Additional materials suitable for cross-linking are disclosed in European Patent Appln. No. 0 164 248 and 0 232 972 and in U.S. Pat. No. 5,128,232, each incorporated herein by reference. Preferred cross-linking agents are amine base cross-linkers such as melamine-formaldehyde resins inclusive of those available for American Cyanamide under the trade names Cymel.

Both the positive working and negative working photoresist compositions described above contain an acid generator used in combination with the resin alone, or a combination of the resin with a cross-linking agent. Preferred acid generators are the sulfonic acid imide generators known as the Brunswold generators and described by Ito et al., at the Proc. SPIE-Int. Soc. Opt. Eng. (1991), 1446 (Adv. Resist Technol. Process. 8), 408–18, incorporated herein by reference. Other useful acid generators include the family of nitrobenzyl esters and the s-triazine derivatives. Suitable s-triazine acid generators are disclosed, for example, in U.S. Pat. No. 4,189,323, incorporated herein by reference.

Non-ionic photoacid generators are suitable including halogenated non-ionic, photoacid generating compounds such as, for example, 1,1-bis[p-chlorophenyl]-2,2,2-trichloroethane (DDT); 1,1-bis [p-methoxyphenyl]-2,2,2-trichloroethane; 1,2,5,6,9,10-hexabromocyclododecane; 1,10-dibromodecane; 1,1-bis[p-chlorophenyl]-2,2-dichloroethane; 4,4-dichloro-2-(trichloromethyl) benzhydrol (Kelthane); hexachlorodimethyl sulfone; 2-chloro-6-(trichloromethyl) pyridine; o,o-diethyl-o-(3,5,6-trichloro-2-pyridyl)phosphorothionate; 1,2,3,4,5,6-hexachlorocyclohexane; N(1,1-bis [p-chlorophenyl]-2,2,2-trichloroethyl)acetamide; tris[2,3-dibromopropyl] isocyanurate; 2,2-bis[p-chlorophenyl]-1,1-dichloroethylene; tris[trichloromethyl]s-triazine; and their isomers, analogs, homologs, and residual compounds. Suitable photoacid generators are also disclosed in European Patent Application Nos. 0164248 and 0232972, both referenced above.

Onium salts are also suitable acid generators. Onium salts with weakly nucleophilic anions have been found to be particularly suitable. Examples of such anions are the halogen complex anions of divalent to heptavalent metals or non-metals, for example, Sb, Sn, Fe, Bi, Al, Ga, In, Ti, Zr, Sc, D, Cr, Hf, and Cu as well as B, P, and As. Examples of suitable onium salts are diaryl-diazonium salts and onium salts of group Va and B, Ia and B and I of the Periodic Table, for example, halonium salts, quaternary ammonium, phosphonium and arsonium salts, aromatic sulfonium salts and sulfoxonium salts or selenium salts. Examples of suitable preferred onium salts can be found in U.S. Pat. Nos. 4,442,197; 4,603,101; and 4,624,912, all incorporated herein by reference.

Another group of suitable acid generators is the family of sulfonated esters including sulfonyloxy ketones. Suitable sulfonated esters have been reporting in J. of Photopolymer Science and Technology, vol. 4, No. 3,337–340 (1991), incorporated herein by reference, including benzoin tosylate, t-butylphenyl alpha-(p-toluenesulfonyloxy)-acetate, and t-butyl alpha-(p-toluenesulfonyloxy)-acetate.

A particularly suitable group of acid generating compounds are the iodonium salts. A preferred group of iodonium salts are those resulting from the condensation of aryl iodosotosylates and aryl ketones as disclosed, for example, in U.S. Pat. No. 4,683,317 incorporated herein by reference. Acid generators that are particularly preferred for near and deep U.V. exposure include 1,1-bis(p-chlorophenyl)-2,2,2-trichloroethane (DDT); 1,1-bis(p-methoxyphenol)-2,2,2-trichloroethane; 1,1-bis(chlorophenyl)-2,2,2 trichloroethanol; tris(1,2,3-methanesulfonyl)benzene; and tris (trichloromethyl)triazine.

Whether positive acting or negative acting, when the photoresist is to be used for exposure at the shorter wavelengths of 193 nm or less, additives to the photoresist composition are desirably non-aromatic. Accordingly, with regard to the examples acid generators and crosslinking agents given above, though aromatic materials have been disclosed for purposes of a complete description of suitable species, it should be understood that they constitute a lesser preferred embodiment of the invention for photoresists designed for exposure to activating radiation at wavelengths of 193 nm or less.

The invention described herein is a positive or negative acting, chemically amplified photoresist composition formulated using an acrylic resin polymerized in a reaction solvent that dissolves all monomers and is capable of functioning as a casting solvent for the fmal coating composition. The acrylic resin is formed from one or more acrylic or methacrylic monomers having functional groups that enable use of the acrylic as a photoresist binder in a chemically amplified system. Functional groups as used in this context refers to groups substituted onto an acrylic monomer used to form the acrylic resin that are acid labile groups if the resist is a positive resist or reactive sites for crosslinking if the resist is a negative resist. The functionalization of the monomer is desirably accomplished prior to polymerization. For example, if the photoresist is to be a positive acting photoresist, the acid labile functional group is substituted on the photoresist prior to polymerization of the acrylic monomer mixture using procedures such as those taught in the above cited references relating to the use of acid labile groups in photoresist formulations to liberate carboxyl groups. If the photoresist is to be a negative acting photoresist, the monomer is one having functional groups able to participate in a crosslinking reaction. The hydroxy or carboxyl groups are desirable functional groups.

The number of functional groups substituted onto the acrylic resin capable of reacting with the photoacid may vary within relative broad limits. For example, the acrylic resin may contain as many as one reactive functional group per repeating polymer unit or as few as one functional group per fifty repeating units. Preferably, the reactive functional groups comprise from 0.1 to 35 mole percent of the acrylic polymer and more preferably, from about 1 to 10 mole percent.

The monomer used to form the acrylic polymer may be one selected from one or both of the following:

and

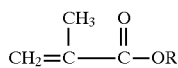

where each R is independently selected from an acid labile or a crosslinkable group, each as described above, or from a member of the group hydrogen, alkyl including cylcoalkyl having up to 16 carbon atoms such as methyl, ethyl, propyl, isopropyl, n-butyl, sec-butyl, isobutyl, tert-butyl, hexyl, heptyl, 2-heptyl, hexadecyl, cyclohexyl, 2-ethoxyethyl, isobornyl, aryl such as benzyl, alkaryl such as phenethyl or 4-phenylbutyl, etc. Examples of suitable materials acrylic acid, methacrylic acid, ethyl acrylate, benzyl acrylate and methacrylate, etc. Other illustrative examples can be found in U.S. Pat. No. 4,139,391 incorporated herein by reference.

In addition to the above monomers, the polymer may also be formed from a monomer mixture including the above monomers further combined with an anhydride monomer conforming to the formula:

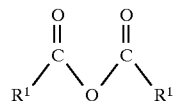

where each R' is independently selected from the group of hydrogen, alkyl having from 1 to 10 carbon atoms including cyloalkyl, aryl, alkaryl, etc. In addition, each R' may be bonded to the other by a single or double bond to form a cylclic compound. Examples of anhydrides that may be used in the formulation include itaconic anhydride, citraconic anhydride and maleic anhydride.

A portion of the monomer selected must have the acid labile group if a positive resist is desired, or a reactive group capable of crosslinking with an acid activated crosslinking agent if a negative resist is desired, in an amount sufficient to provide an acrylic resin having the mole percent reactive functional groups defined above.

The acrylic polymers of the invention may be formed from mixtures of acrylic and methacrylic monomers combined with other ethylenically unsaturated monomers as is known in the art. Monomers having vinyl substitution typically copolymerized with monomeric acrylic esters include vinyl compounds having amino functionality such as tert-butyl amino ethyl methacrylate and dimethyl amino ethyl methacrylate, monomers having n-hydroxymethyl substitution such as n-hydroxymethyl acrylamide and n-hydroxymethyl methacrylamide, monomers having an oxirane group such as glycidyl methacrylate, multifunctional monomers such as 1,4-butylene dimethacrylate, styrene monomers such as hydroxy styrene and miscellaneous other vinyl monomers such as vinyl chloride, vinylidine chloride and vinyl acetate, etc. A particularly preferred group of comonomers are heterocyclic vinyl anhydrides where the ethelinic unsaturation is either pendant to the heterocyclic ring or part of the heterocyclic ring. The preferred heterocyclic vinyl anhydride has one oxygen within the ring structure. Typical monomers of this type include itaconic anhydride, citraconic anhydride and maleic anhydride. Aromatic vinyl monomers may be used as well, but such monomers constitute a lesser preferred embodiment of the invention because aromatic rings absorb activating radiation during exposure decreasing the optical transparency of the resulting polymer, especially at 193 nmn.

In accordance with the invention, the acrylic polymer is made using a solvent that is suitable for use as a casting solvent for the polymer so formed. The typical procedure for formation of an acrylic ester polymer involves dissolution of the monomers in the solvent. An organic radical initiator is then added to the mixture. Typical organic radical initiators are known in the art and include materials such as azo compounds, azide compounds, peroxides and peresters, keto compounds, organic sulfur compounds, trihalomethane compounds, etc. The preferred material used is one that does not form residues that adsorb at wavelengths of 193 nm or less.

Specific keto compounds include diacetyl, benzyl, benzoin, 2-hydroxy-2-methyl-1-phenylpropan-1-one, 1-(4-isopropylphenyl)-2-hydroxy-2-methylpropan-1-one, 4-(2-hydroxyethoxy)phenyl-2-(hydroxy-2-propyl)ketone, 1-hydroxycyclohexylketone, 2,2-dimethoxy-2-phenylacetophenone, 2-methyl[4-(methylthio)phenyl]-2-morpholino-1-propan-1-one, 2-benzyl-2-dimethylamino-1-(4-morpholinophenyl)-butan-1-one, benzophenone, 4,4'-bis (dimethylamino)benzophenone, 4,4'-bis(diethylamino) benzophenone, 2,4-diethylthioxanthone and 3,3-dimethyl-4- methoxybenzophenone. Specific examples of the azo or azide compound include azoisobutyronitirle, 4-azidobenzaldehyde, 4-azidoacetophenone, 4-azidobenzalacetophenone, 4-azidobenzalacetone, azidopyrene, 4-diazodiphenylamine, 4-diazo-4'-methoxydiphenylamine and 4-diazo-3'-methoxydiphenylamine, etc. An exemplary organic sulfur compound is methyl mercaptan. A specific peroxide is diethyl ether peroxide. An exemplary perester is t-butyl peroctoate. Specific examples of trihalomethane compounds include 1,3-bis(trichloromethyl)-5-(2'-chlorophenyl)-s-triazine and 1,3-bis(trichloromethyl)-5-(4'-methoxyphenyl)-s-triazine. For reasons set forth above, preferred materials are non-aromatic.

Following dissolution of the reactants in the solvent, the reaction mixture is heated to an elevated temperature, typically between 100° and 150° C. The reaction is permitted to proceed to completion, typically over a period of about 2 hours. Following completion of the polymerization reaction, the polymer is typically recovered from solution as a dry powder.

The polymerization of acrylate monomers in the presence of an organic radical initiator is rapid resulting in formation of high molecular weight resins. Typically, resins formed by the conventional processes have a molecular weights in excess of 10,000 Daltons, typically in excess of 20,000 Daltons and often a molecular weight up to 100,000 Daltons or more. It is known that as the molecular weight of a polymer increases, its solubility in solvent decreases. Consequently, polymers formed by the conventional process have limited solubility in conventional solvents relative to acrylic polymers having a molecular weight below 10,000 Daltons. In accordance with the subject invention, it is preferred that reaction conditions such as time, temperature and concentration of initiator by controlled to provide acrylic polymers of lower molecular weight than those obtained in the more conventional process, typically a molecular weight not exceeding 10,000.

The solvent selected for purposes of the reaction is one capable of dissolving all monomers, additives to the reaction mixture and polymer formed by reaction. In addition, the solvent should be one capable of use as a casting solvent for the polymer formed, particularly for use as a casting solvent for a photoresist. In this respect, it may be necessary to use solvent mixtures. Most preferably, the solvent has a boiling point varying between 115° C. and 220° C., preferably varying between 125° C. and 185° C., and a heat of vaporization varying between 9.0 and 25 cal/mol and more preferably, between 10.0 and 20 cal/mol.

Solvents meeting the above criteria include alkyl glycol ethers such as diglyme and triglyme, alkyl glycol esters such as ethyl lactate and ethyl ethoxy propionate and ketones such as 3-pentanone, cyclopentanone and cyclohexanone.

The process of the invention is similar to processes of the prior art except that in prior art process, the acrylic resin once formed would be separated from solution. In accordance with the process of the subject invention, the solution of the acrylic resin formed may be used to formulate a photoresist without separation of the resin from the reaction solution. Consequently, to formulate a photoresist using the reaction mixture, it is only necessary to add additional additives to the solution such as a photoacid generator if a positive resist is formulated or a photoacid generator and a cross-linking agent if a negative resist is formulated. A photoresist prepared in accordance with the invention will have a concentration of components as follows expressed in weight percent:

|  | Positive Resist | | Negative Resist | |
| --- | --- | --- | --- | --- |
|  | Broad | Preferred | Broad | Preferred |
| Polymer | 5.0–50.0 | 10.0–30.0 | 5.0–50.0 | 10.0–30.0 |
| Photoacid Generator | 0.1–4.0 | 0.2–2.0 | 0.1–4.0 | 0.2–2.0 |
| Crosslinking Agent | — | — | 0.5–10.0 | 1.0–7.5 |
| Solvent | 50.0–95.0 | 70.0–90.0 | 50.0–95.0 | 70.0–90.0 |

With regard to the above concentrations, it should be recognized that a crosslinking agent is not required for the negative photoresists as the photolithographic reaction involves an acid catalyzed insolubilization of the resin resulting in selective dissolution inhibiting properties in the resist. In addition to the above components, other additives may be present in the photoresist composition such as plasticizers, dissolution inhibitors, dyes, modifiers, etc.

Formation of the photoresist following the procedure set forth above results in a polymer desirably having a lower molecular weight than polymers formed using conventional solvents. For example, polymers are formed in accordance with the procedures of the invention having a low molecular weight, typically below 10,000 Daltons and typically within a range of from 4,000 to 8,000 Daltons.

As a further advantage to the process of the subject invention, for reasons not fully understood, polymer prepared in accordance with the process of the invention possesses a substantially reduced tendency to yellow during storage. It is known in the art that acrylic resins yellow upon exposure to the atmosphere, whether in solution or in the form of a dry coating. For reasons not understood, acrylic resins formed in accordance with the procedures of the subject invention remain substantially water white for extended periods of time. This is a particularly advantageous property of a polymer used in a photoresist composition.

The invention will be better understood by reference to the examples which follow.

EXAMPLE 1

A 1 liter 5- necked round bottomed flask was equipped with a motor driven stirrer, two calibrated pumps for introducing raw materials, a thermocouple temperature monitor, a nitrogen inlet and a condenser. Temperature was controlled to within ±2° C. by means of a heating mantle mounted on a remote controlled pneumatic jack and connected to said thermocouples in such a way as to allow said heating mantle to be raised or lowered from the bottom of the flask. Before beginning the reaction, the system was purged with dry nitrogen for approximately 10 min.

All reagents were obtained from Aldrich Chemical Company except for t-butyl methacrylate, which was obtained from Monomer, Polymer and Dajac Laboratories Inc., t-butyl peroctoate brand free radical initiator, which was obtained form ATOCHEM America and ethyl lactate which was obtained from Purac Chemical Company.

A charge of 140 ml of dry, purified ethyl lactate solvent was added to said round bottomed flask. The solvent was warmed under nitrogen to 115° C. and maintained at that temperature.

In a separate vessel (addition vessel A) was weighed a solution comprised of 6 g of t-butyl peroctoate brand free radical initiator (available from ATOCHEM) and 106 g of dry, purified ethyl lactate solvent. Vessel A was connected by means of a tube to one of the above pumps, calibrated to deliver the charge in addition vessel A to the reaction vessel in 140 min.

Addition vessel B was charged with 25 g of methacrylic acid, 150 g of isobornyl methacrylate, 37.5 g of t-butyl methacrylate and a solution consisting of 37.5 g of itaconic anhydride in 200 g ethyl lactate. The total solution volume was approximately 450 ml. Vessel B was connected by means of a tube to the second pump which was calibrated to deliver the entire charge in Addition Vessel B to the reaction vessel in 120 min.

Both pumps were primed and their outlet tubes were secured to the inlet port of the reaction vessel. The reaction was begun when the pumps were started simultaneously. Throughout the reaction, temperature was maintained at 115° C. ±2° C. Addition of the monomer charge (reaction vessel B) was completed in 120 min. Complete addition of the initiator addition (reaction vessel A) required an additional 20 min. The reaction mixture was maintained at 115°±2° C. for an additional 60 min after the initiator charge was completed. 133.3 g of ethyl lactate was added to the reaction mixture, which was then stirred for 3–5 min. to form a homogenous solution.

The resultant solution, which consisted of 30% polymer in ethyl lactate, was stored for later study. Over the course of several months, the solution was observed to remain clear and colorless. Analysis of the resulting polymer by gel permeation chromatography showed the weight average molecular weight, $M_w$ to be approximately 5800 D and the number average molecular weight, $M_n$ of 3,400 D. The solution so formed remained colorless and without precipitate for in excess of six months.

EXAMPLE 2

The synthesis according to Example 1 was repeated except that the reaction solvent was diglyme. In this case, the $M_w$ and $M_n$ values were 12200 and 5540 respectively. Over the course of several weeks, the solution was observed to turn a pale yellow color and a precipitate began to form during its first week of storage.

EXAMPLE 3

The synthesis according to Example 1 except that citraconic anhydride was replaced by itaconic anhydride. Over the course of several months, the solution was observed to remain clear and colorless. Analysis of the resulting polymer by gel permeation chromatography showed the weight average molecular weight, $M_w$ to be approximately 5700 D and the number average molecular weight $M_n$ of 3300 D.

EXAMPLE 4

The procedure of Example 1 was repeated except that the monomer feed consisted of 162.5 g of isobornyl methacrylate, 50 g of methacrylic acid, 25 g of 2-hydroxyethyl methacrylate and 12.5 g of itaconic anhydride.

The following examples represent preparation of photoresists using resins prepared in accordance with the subject invention.

EXAMPLE 5

Into a 3 oz. wide mouth bottle were weighed 33.3 g of the polymer solution of Example 1, 0.42 g of [N-(Perfluoro-1-octanesulfonyl)oxy]-5-norbornene-2,3-dicarboximide, 0.010 g of Silwet 7604, available from Union Carbide and an additional 34.61 g of dried, purified ethyl lactate. The mixture was warmed to 50° C. and stirred until a homogenous mixture was obtained and filtered to 0.1 µm. Over several days small particles, believed to consist of the [N-(Perfluoro-1-octanesulfonyl)oxy]-5-norbornene-2,3-dicarboximide began to form in the solution.

The resulting resist was coated on a 100 mm silicon wafer to a thickness of 0.7 µm, softbaked at 100° C. for 60 sec, exposed at 193 nm using 0.5 NA optics on an SVGL 193 nm exposure instrument (SVG Lithography), post-exposure baked at 100° C. for 60 sec and developed in a commercially available aqueous alkaline developer identified as MFCD26 Developer by Shipley Company, L. L. C. Imaging of 0.22 µm was achieved.

EXAMPLE 6

The procedure of Example 5 was repeated except that the additional solvent consisted of 11.9 grams of ethyl lactate and 22.71 grams of propylene glycol monomethyl ether acetate. The resulting solution was observed to be more stable to precipitation than the resist of Example 5.

EXAMPLE 7

The synthesis according to Example 5 was repeated except that citraconic anhydride was replaced by itaconic anhydride. Over the course of several months, the solution was observed to remain clear and colorless. Analysis of the resulting polymer by gel permeation chromatography showed the weight average molecular weight, $M_w$ to be approximately 5700 Daltons and the number average molecular weight $M_n$ to be 3300 Daltons.

EXAMPLE 8

The resist according to Example 6 was prepared except that the polymer of Example 2 was used as the base polymer and the additional solvent consisted of diglyme.

EXAMPLE 9

The resist according to Example 7 was prepared except that Silwet 7604 surfactant was used as the surface leveling agent in place of FC-430 surfactant. Equivalent coating quality was achieved.

EXAMPLE 10

The resist according to Example 5 was prepared except that the polymer of Example 3 was used.

EXAMPLE 11

Into a 3 oz wide mouth bottle were weighed 33.3 g of the polymer solution of Example 4, 1.44 g of the crosslinking agent Cymel 303, available from American Cyanamid, 0.42 g of [N-(Perfluoro-1-octanesulfonyl)oxy]-5-norbornene-2, 3-dicarboximide, 0.014 g of Silwet 7604, available from Union Carbide and an additional 34.61 g of dried, purified ethyl lactate. The mixture was warmed to 50° C. and stirred until a homogenous mixture was obtained and filtered to 0.1 µm.

The resulting resist was coated onto a 100 mm silicon wafer to a thickness of 0.7 µm, softbaked at 100° C. for 60 sec, exposed at 193 nm using 0.5 NA optics on an SVGL 193 nm exposure instrument (SVG Lithography), post-exposure baked at 100° C. for 60 sec and developed in MFCD26 Developer (identified above). A negative tone image with a resolution of 05 µm was obtained.

We claim:

1. A method for formation of an acrylic resin coating, said method comprising the steps of dissolving one or more acrylate monomers in an ethyl lactate solvent, heating said dissolved acrylate monomers in the presence of an organic radical initiator under conditions to polymerize the monomers to form an acrylic resin that has a weight average molecular weight below about 10,000 Daltons, and in the absence of a step of recovering the acrylate polymer from its reaction solution in ethyl lactate, casting said reaction mixture onto a surface.

2. The method of claim 1 where the acrylate monomer is a member selected from the group consisting of aliphatic acrylates and methacrylates.

3. The method of claim 1 where the acrylate monomers comprise a mixture of acrylates and methacrylates.

4. The method of claim 3 where at least a portion of the acrylate monomer is substituted with an acid cleavable group.

5. The method of claim 1 further containing an anhydride monomer.

6. The method of claim 5 where the anhydride is selected from the group consisting of maleic anhydride, itaconic anhydride and citraconic anhydride.

7. A method for formation of a photolithographic acrylate coating over a substrate, said method comprising the steps of dissolving one or more aliphatic acrylate or methacrylate monomers in an ethyl lactate solvent, heating said dissolved monomers in the presence of an organic radical initiator to form an acrylic polymer having a weight average molecular weight below about 10,000 Daltons, and without recovering said acrylic polymer from said ethyl lactate solvent, coating said solution onto said substrate.

8. The method of claim 7 including the additional step of dissolving a photoacid generator in the solution prior to coating of the same onto a substrate.

9. The method of claim 8 where at least a portion of the acrylate monomer is substituted with an acid cleavable group.

10. The method of claim 7 including the additional step of dissolving a crosslinking agent and a photoacid generator in the solution of polymer prior to coating the same onto a substrate.

11. The method of claim 10 where the crosslinking agent is capable of crosslinking with an acrylic resin when in the presence of a photogenerated acid.

12. The method of claim 7 further containing an anhydride monomer.

13. The method of claim 12 where the anhydride is selected from the group consisting of maleic anhydride, itaconic anhydride and citraconic anhydride.

14. A method for making a liquid photoresist coating composition, said method comprising the steps of dissolving one or more aliphatic acrylate or methacrylate monomers in an ethyl lactate solvent, heating said dissolved monomers in the presence of an organic radical initiator to from an acrylic polymer having a weight average molecular weight below about 10,000 Daltons, and without recovering said polymer from said ethyl lactate solvent, dissolving a photoacid generator in solution.

15. The method of claim 14 where all components of the photoresist coating composition are free of aromatic constituents.

16. The method of claim 14 where the acrylate monomer is a member selected from the group consisting of aliphatic acrylates and methacrylates.

17. The method of claim 14 futher containing an anhydride nonomer.

18. The method of claim 17 where the anhydride is selected from the group consisting of maleic anhydride, itaconic anhydride and citraconic anhydride.

19. The method of claim 14 where at least a portion of the acrylate monomer is substituted with an acid cleavable group.

20. The method of claim 14 including the additional step of dissolving a crosslinking agent in the solution capable of crosslinking with an acrylic polymer.

21. A method for formation of an acrylic resin coating composition containing an acrylic resin having a weight average molecular weight below about 10,000 Daltons, said method comprising the steps of dissolving one or more acrylate monomers in an ethyl lactate solvent, heating said dissolved acrylate monomers in the presence of an organic radical initiator to polymerize the monomers under conditions where the weight average molecular weight does not exceed 10,000 Daltons, and in the absence of a step of recovering the acrylate polymer from its reaction solution, casting said reaction mixture onto a surface.

22. The method of claim 21 where the acrylate monomer is a member selected from the group consisting of aliphatic acrylates and methacrylates.

23. The method of claim 21 where the acrylate monomer is a mixture of acrylates and methacrylates.

24. The method of claim 23 where at least a portion of the acrylate monomer is substituted with an acid cleavable group.

25. The method of claim 21 where the monomers contain an anhydride as an additional component.

26. The method of claim 25 where the anhydride is selected from the group consisting of maleic anhydride, itaconic anhydride and citraconic anhydride.

27. The method of claim 21 where the molecular weight varies between about 4,000 and 8,000 Daltons.

28. The method of claim 21 including the additional step of dissolving a photoacid generator in the solution prior to coating of the same onto a surface.

29. The method of claim 21 including the additional step of dissolving a crosslinking agent and a photoacid generator to the solution prior to coating the same onto a surface.

* * * * *